US012787474B2

(12) United States Patent
Schmidt et al.

(10) Patent No.: US 12,787,474 B2
(45) Date of Patent: Nov. 3, 2026

(54) METHOD FOR PRODUCING A PHOTODIODE

(71) Applicant: VISHAY SEMICONDUCTOR GMBH, Heilbronn (DE)

(72) Inventors: Manuel Schmidt, Waghäusel (DE); Simon Richter, Massenbachhausen (DE); Christian Specht, Neuenstadt am Kocher (DE)

(73) Assignee: Vishay Semiconductor GmbH, Heilbronn (DE)

( * ) Notice: Subject to any disclaimer, the term of this patent is extended or adjusted under 35 U.S.C. 154(b) by 438 days.

(21) Appl. No.: 18/038,780

(22) PCT Filed: Dec. 3, 2021

(86) PCT No.: PCT/EP2021/084141
§ 371 (c)(1),
(2) Date: May 25, 2023

(87) PCT Pub. No.: WO2022/117804
PCT Pub. Date: Jun. 9, 2022

(65) Prior Publication Data

US 2024/0105878 A1 Mar. 28, 2024

(30) Foreign Application Priority Data

Dec. 4, 2020 (DE) ......................... 102020132289.5

(51) Int. Cl.
*H10F 71/00* (2025.01)
*H10F 30/221* (2025.01)

(52) U.S. Cl.
CPC ......... *H10F 71/121* (2025.01); *H10F 71/128* (2025.01); *H10F 30/2218* (2025.01)

(58) Field of Classification Search
CPC .. H10F 71/121; H10F 71/128; H10F 30/2218; H10F 71/00; H10F 30/221;
(Continued)

(56) References Cited

U.S. PATENT DOCUMENTS 5,719,414 A 2/1998 Sato
5,956,570 A * 9/1999 Takizawa ............. H10F 39/153 438/57

(Continued)

FOREIGN PATENT DOCUMENTS

CN 104425523 A * 3/2015 ......... H10F 39/8053
DE 4102285 A1 8/1992

(Continued)

OTHER PUBLICATIONS

International Search Report and Written Opinion dated Mar. 16, 2022 for corresponding International Application No. PCT/EP2021/084141, and English translation thereof.

(Continued)

*Primary Examiner* — Earl N Taylor
(74) *Attorney, Agent, or Firm* — Volpe Koenig

(57) ABSTRACT

A method of producing a photodiode having a layer structure that comprises a front-side first semiconductor layer of a first conductivity type, a second semiconductor layer of a second conductivity type into which the first semiconductor layer is embedded, and an adjoining rear-side third semiconductor layer of the second conductivity type having a higher doping concentration in comparison with the second semiconductor layer includes providing a substrate wafer composed of a semiconductor material. A layer sequence having a first, second, and third semiconductor region on and/or in the substrate wafer is produced. The first and second semiconductor regions form the first and second semiconductor layers, and the layer sequence is partly removed from the (Continued)

rear side of the substrate wafer until the third semiconductor region is reduced to the thickness of the third semiconductor layer.

15 Claims, 2 Drawing Sheets

(58) Field of Classification Search
CPC ... H10F 39/026; H10F 77/206; H01L 31/186; H01L 31/103; H01L 31/022408; H01L 31/14687; H01L 31/1804; H01L 31/1864; H01L 31/1037
See application file for complete search history.

(56) References Cited

U.S. PATENT DOCUMENTS

| | | | | |
|---|---|---|---|---|
| 7,256,386 | B2 | 8/2007 | Carlson et al. | |
| 7,521,335 | B2 | 4/2009 | Yamanaka | |
| 2004/0041225 | A1 | 3/2004 | Nemoto | |
| 2015/0091117 | A1* | 4/2015 | Heo | H10K 39/36 257/432 |
| 2015/0260659 | A1 | 9/2015 | Chuang | |
| 2021/0126150 | A1* | 4/2021 | Schmidt | H10F 71/00 |
| 2024/0105878 | A1* | 3/2024 | Schmidt | H10F 71/00 |

FOREIGN PATENT DOCUMENTS

| | | | | | |
|---|---|---|---|---|---|
| EP | 2096667 | A2 | * | 9/2009 | H10D 30/798 |
| JP | H06-350122 | A | | 12/1994 | |
| JP | H0918048 | A | | 1/1997 | |
| JP | H09321266 | A | * | 12/1997 | H01L 31/1804 |
| JP | 2000252512 | A | * | 9/2000 | |
| JP | 2004-193278 | A | | 1/2006 | |
| JP | 2010232420 | A | * | 10/2010 | |
| JP | 2011249780 | A | | 12/2011 | |
| JP | 2013093442 | A | * | 5/2013 | |
| TW | 2005-31301 | A | | 9/2005 | |
| WO | WO-0182382 | A1 | * | 11/2001 | H10F 77/244 |
| WO | 2015027621 | A1 | | 3/2015 | |

OTHER PUBLICATIONS

Notice of Preliminary Rejection dated Sep. 6, 2025, in corresponding Korean Application No. 10-2023-7018553, and English translation thereof (21 pages).

Notice of Reasons for Refusal dated Jul. 29, 2025, in corresponding Japanese Application No. 2023-533826, and English translation thereof (8 pages).

Indian Examination Report dated May 29, 2026, in corresponding Indian Application No. 202317036251, 6 pages.

* cited by examiner

METHOD FOR PRODUCING A PHOTODIODE

CROSS-REFERENCE TO RELATED APPLICATIONS

This application is a 371 National Phase application of International Application No. PCT/EP2021/084141, filed Dec. 3, 2021, which claims priority to German Patent Application No. 102020132289.5, filed on Dec. 4, 2020, which are both incorporated by reference as if fully set forth herein.

The present invention relates to a method of producing a photodiode having a layer structure that comprises a front-side first semiconductor layer of a first conductivity type, a second semiconductor layer of a second conductivity type into which the first semiconductor layer is embedded, and an adjoining rear-side third semiconductor layer of the second conductivity type having a higher doping concentration in comparison with the second semiconductor layer, wherein the first and second semiconductor layers define a p-n-junction and the third semiconductor layer defines a back surface field.

In common photodiodes, in particular in silicon photodiodes, the space charge zone or depletion zone of the p-n junction usually only extends over a small part region of the photodiode structure that is near the surface. Deeper-lying regions of the photodiode do not have a charge carrier depletion and therefore also do not have an electrical field.

When light is absorbed in the photodiode, a charge carrier pair, i.e. an electron-hole pair, is created. When such a charge carrier pair is created within the electrical field of the depletion zone, the charge carriers are immediately separated from one another, whereby an electric current or photocurrent is generated.

However, if the light absorption and the associated charge carrier generation takes place in deeper zones of the photodiode and thus outside the depletion zone, the charge carriers diffuse in arbitrary directions. A charge carrier generation and diffusion outside the depletion zone in particular occurs for infrared light since the latter has a comparatively higher penetration depth than visible light. The charge carriers created outside the depletion zone can usually only contribute to the electric current flow if they enter the depletion zone. However, lattice and/or surface defects at a rear-side surface of the layer structure act as recombination centers for the charge carriers created, i.e. the charge carriers entering this region are lost by recombination and cannot contribute to the photocurrent. This leads to a reduced light sensitivity, in particular in the infrared range.

To prevent this, a photodiode structure is provided with said third semiconductor layer that has a high doping concentration and thereby defines a so-called back surface field. The doping concentration of the third semiconductor layer which is higher compared to the second semiconductor layer disposed thereabove causes a shift of the band structure and thus generates the back surface field. Depending on the doping type, one of the two charge carrier categories is repelled from the back surface field and is reflected or repelled in the direction of the depletion zone and can contribute to the photocurrent there. A recombination of the charge carriers at the rear side of the photodiode can thereby be prevented.

The doping required to generate a back surface field usually takes place by means of diffusion into the rear side of a semiconductor substrate or wafer serving to produce the layer structure. The penetration depth of the doping material in this respect has to be greater than the depth to which surface defects extend. Therefore, a doping depth of approximately 2 to 4 μm is common. To achieve this penetration depth, high temperatures are required for the performance of the diffusion. However, such high-temperature processes can only be performed at the start of the production process of the photodiode since they would otherwise damage previously created semiconductor structures.

For different areas of use, for example in the field of wearables, it is desirable to use photodiodes whose layer structure only has a comparatively small thickness. Semiconductor thicknesses of less than 185 μm down to 150 μm and less are in particular sought after here. For such small thicknesses, it is, however, problematic for stability reasons to use a wafer whose thickness already corresponds to the desired final thickness of the photodiode at the start of the production process.

Therefore, in conventional production processes, the layer structure is initially produced with a greater thickness in which the thickness of the wafer is initially not reduced. Only after at least a large part of the production steps has been performed and in particular the p-n junction has been produced, does a rear-side removal take place, for example by backside grinding of the wafer. However, a semiconductor region that is intended to define the back surface field would inevitably also be removed during such a rear-side removal such that it has so far not been possible to produce photodiodes having a small thickness and a back surface field.

It is therefore the object of the invention to provide a method of manufacturing a photodiode whose layer structure has a reduced thickness and at the same time has a back surface field.

The object is satisfied by a method having the features of claim 1. The method in accordance with the invention of producing a photodiode having the initially mentioned layer structure comprises:

- providing a substrate wafer composed of a semiconductor material;
- producing a layer sequence having a first, second, and third semiconductor region on and/or in the substrate wafer, wherein the first and second semiconductor regions form the first and second semiconductor layers; and
- partly removing the layer sequence from the rear side of the substrate wafer until the third semiconductor region is reduced to the thickness of the third semiconductor layer.

The ratio of the thickness of the third semiconductor layer to the thickness of the layer structure is not more than 0.25.

In this connection, the terms "front side" or "front-side" refer to the light entry side of the photodiode or of the layer structure. Accordingly, the terms "rear side" or "rear-side" refer to the side of the photodiode or of the layer structure disposed opposite the light entry side. The present invention makes it possible to produce a photodiode having a small thickness that nevertheless has a third semiconductor layer that defines a back surface field. The reduced third semiconductor region defines the third semiconductor layer. The substrate wafer is preferably produced from silicon, particularly preferably from a silicon single crystal. The second semiconductor region generally has a low or normal doping level (weak or medium doping) and the third semiconductor region has a high doping level (heavy doping). A low or normal doping level or a weak or medium doping level is usually understood as a doping concentration that corresponds to at most one donor per $10^7$ semiconductor atoms or at most one acceptor per $10^6$ semiconductor atoms. Accordingly, a high doping level or a heavy doping can correspond to a doping concentration that is higher than said doping concentrations, preferably higher at least by an order of magnitude or at least by a factor of 10 than is defined by the above-mentioned limits. The second semiconductor layer can in particular have a doping concentration that has a steady, in particular constant, or discontinuous course over the thickness of the second semiconductor layer.

The removal of the layer sequence preferably takes place by backside grinding, wherein other methods can also be used alternatively or in combination with a backside grinding process. The removal can in particular also comprise etching and/or polishing steps. At the start of the removal of the layer sequence, the substrate wafer can be present in its provided thickness.

The provided substrate wafer is preferably already produced with a doping of the second conductivity type.

It is understood that the photodiode can have even further layers in addition to said semiconductor layers. They in particular include metal layers that are provided for the electrical contacting of the different semiconductor layers. The method steps necessary for the production of further layers can also be performed before or after the steps of the method in accordance with the invention in time. In general, additional method steps can also be provided between individual steps of the method in accordance with the invention.

In accordance with an advantageous embodiment of the method, the third semiconductor region is formed by the substrate wafer. Accordingly, provision is made that the substrate wafer is provided or produced with a doping concentration that corresponds to the doping concentration of the third semiconductor layer.

In accordance with a further advantageous embodiment of the method, the production of the layer sequence comprises creating the third semiconductor region by a front-side introduction of a doping into the substrate wafer, preferably by means of diffusion or ion implantation. The third semiconductor region is therefore created in the front side of the substrate wafer. After the third semiconductor region has been created, the two other semiconductor regions can then be produced on the third semiconductor region by suitable methods. The removal of the substrate wafer accordingly takes place in such a manner that at least that part which does not correspond to the third semiconductor region is removed by a rear-side removal of the substrate wafer. To ensure that the third semiconductor layer remaining after the ending of the removal has the thickness and doping concentration necessary for forming the back surface field, a certain part of the third semiconductor region is usually additionally also removed.

In accordance with another advantageous embodiment of the method, the production of the layer sequence comprises creating the second semiconductor region by epitaxial growth on the third semiconductor region. The third semiconductor region is preferably already grown doped. In general, a subsequent doping of the grown semiconductor region is also possible, however.

In this embodiment, the removal of the layer sequence comprises completely removing the substrate wafer. The epitaxially grown third semiconductor region thus forms the rear side of the photodiode structure. To ensure that the substrate wafer is actually completely removed also in the case of inaccuracies due to production, a certain part of the third semiconductor region can additionally also be removed.

In accordance with a further advantageous embodiment of the method, the production of the layer sequence comprises creating the second semiconductor region by epitaxial growth on the third semiconductor region. The second semiconductor region is preferably grown already doped. In general, a subsequent doping of the grown semiconductor region is also possible, however.

In accordance with an alternative embodiment of the method in accordance with the invention, the production of the layer sequence comprises creating the third semiconductor region by a rear-side introduction of a doping into the substrate wafer, preferably by means of diffusion. Here, the substrate wafer is preferably doped to such an extent that also in the case of an occurring doping gradient having a doping concentration that is being removed from the rear side to the front side, the substrate wafer has a doping concentration corresponding to the third semiconductor layer at a desired depth. The doping introduced into the substrate wafer corresponds to the second conductivity type and, if necessary, increases a doping concentration already present on the production of the substrate wafer.

In this connection, it is preferred that the doping is only introduced into a rear-side part region of the substrate wafer and the second semiconductor region is formed by the remaining part region of the substrate wafer. For this purpose, a substrate wafer is preferably used that has a doping concentration at the production side corresponding to the second semiconductor layer. The doping or the additional doping for the third semiconductor region is introduced only to such a depth that the doping material does not reach the remaining part region of the substrate wafer provided for the second semiconductor region. In this embodiment of the method, the doping has to take place at a particularly large penetration depth.

In accordance with an advantageous embodiment of the method, the production of the layer sequence comprises creating the first semiconductor region after the second semiconductor region and/or creating the second semiconductor region after the third semiconductor region.

In accordance with a further advantageous embodiment of the method, the production of the layer sequence comprises creating the first semiconductor region by a front-side doping in the second semiconductor region by means of ion implantation. Thus, the introduced front-side doping corresponds to the first conductivity type. Since the second semiconductor region is doped in accordance with the second conductivity type, an amount of doping material first has to be introduced here that neutralizes the oppositely directed doping of the second conductivity type. The doping is then continued until the doping concentration required for the first semiconductor layer is reached.

The invention further relates in a secondary aspect to a method having the features of claim 11. This method of producing a photodiode having the initially mentioned layer comprises:

- providing a substrate wafer composed of a semiconductor material;
- producing a layer sequence having a first and second semiconductor region in the substrate wafer, wherein the first semiconductor region forms the first semiconductor layer;
- removing the layer sequence from the rear side until the second semiconductor region is reduced to the total thickness of the second and third semiconductor layers;

producing a third semiconductor region forming the third semiconductor layer by a rear-side introduction of a doping into the second semiconductor region, preferably by means of diffusion or ion implantation; and locally heating the third semi-conductor region.

The ratio of the thickness of the third semiconductor layer to the thickness of the layer structure is not more than 0.25.

The local heating of the third semiconductor region is preferably performed such that lattice defects in the boundary layer caused by the introduction of the doping and/or by the removal of the layer sequence are cured. The local heating is preferably performed such that in particular the p-n junction formed between the first and second semiconductor layers is not damaged by excessive heating. Further developments of the initially mentioned method, as far as applicable, also apply to this method variant.

Methods that produce a rapid temperature increase within a short time can preferably be considered for the local heating of the third semiconductor region. Due to the supply of a large amount of heat in a short period of time, it is achieved that the third semiconductor region rapidly increases to the temperature necessary for curing without the temperature in other regions of the layer structure, in particular in the region of the p-n junction, increasing above a harmless level due to the thermal conductivity.

In accordance with a preferred embodiment of this method variant, the local heating of the third semiconductor region takes place by laser annealing. It has been shown that laser annealing is particularly suitable for curing lattice defects without excessive heating of remaining semiconductor regions.

In accordance with an advantageous embodiment of the methods, the first conductivity type is p-type and the second conductivity type is n-type. It follows that the first semiconductor layer is p-type and the second and third semiconductor layers are n-type. Alternatively, a reverse assignment of the conductivity types can also be selected, i.e. the first semiconductor layer is n-type and the second and third semiconductor layers are p-type.

As already mentioned above, the substrate wafer is preferably formed from silicon. Substrate wafers composed of silicon are widely used and therefore inexpensive. They have proven themselves in the production of photodiodes.

In accordance with an advantageous embodiment of the methods, the thickness of the photodiode does not amount to more than 200 μm, preferably not more than 185 μm. Said thickness of the photodiode in particular comprises said layer structure, i.e. the first, second and third semiconductor layers as well as, if applicable, additionally present functional layers such as front-side and/or rear-side metal layers that are provided for an electrical contacting. Housing components, protective windows or the like are not included in the dimensioning of the thickness.

The thickness of the provided substrate wafer preferably does not amount to more than 300 μm, preferably not less than 220 μm. Substrate wafers whose thickness is in the mentioned range have been found to be sufficiently stable for the production methods in accordance with the invention and an excessive amount of material does not have to be removed. In general, thicker substrate wafers can, however, also be provided, whereby the step of removing is then extended in a corresponding manner. If wafers are to be used that have a greater production thickness, for example a production thickness of 600 μm, they can be removed to the desired substrate wafer thickness of not more than 300 μm, preferably not less than 220 μm, prior to the provision for the methods in accordance with the invention, preferably by backside grinding.

In accordance with a further advantageous embodiment of the method, the thickness of the third semiconductor layer, i.e. of the back surface field, does not amount to more than 20 μm, preferably not more than 10 μm, preferably not more than 5 μm.

The ratio of the thickness of the third semiconductor layer to the thickness of the layer structure preferably does not amount to more than 0.20, preferably not more than 0.15, preferably not more than 0.10, preferably not more than 0.05, preferably not more than 0.02.

The provision of a substrate wafer can comprise providing a substrate wafer of the second conductivity type having the higher doping concentration. Alternatively, the second semiconductor layer of the second conductivity type can have a lower doping concentration in comparison with the third semiconductor layer, wherein the provision of a substrate wafer comprises providing a substrate wafer of the second conductivity type having the lower doping concentration.

Further advantageous embodiments of the methods in accordance with the invention result from the dependent claims, from the description, and from the drawings.

The invention will be explained in the following with reference to embodiment examples and to the drawings. There are shown:

Figure 1:
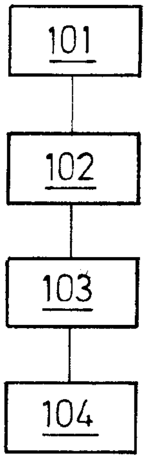
FIG. 1 is a flowchart of a method of producing a photodiode in accordance with a first embodiment.

In the exemplary embodiments of the method described in the following, only those method steps that are essential for the understanding of the invention are described in the flowcharts. In general, additional method steps can also be provided that are performed chronologically before, between, or during the method steps shown in the flowcharts.

The sectional representations of the photodiode layer sequences are only schematic and not to scale. Furthermore, the described method embodiments refer only by way of example to a single photodiode in each case. It is understood that typically a plurality of photodiodes, which are separated from one another in a separation step, usually towards the end of the production process, for example by sawing, are produced simultaneously on a single substrate wafer.

In the following, for reasons of clarity, the same or similar features are each designated by the same reference numerals even if they may differ from one another in terms of their properties.

The embodiments described in the following with reference to FIGS. 1 to 8C each relate to a method of producing a photodiode 30 having a layer structure which comprises a front-side first semiconductor layer 22 of a first conductivity type, a second semiconductor layer 24 of a second conductivity type into which the first semiconductor layer 22 is embedded, and an adjoining rear-side third semiconductor layer 26, i.e. which adjoins the second semiconductor layer 22, of the second conductivity type having a higher doping concentration in comparison with the second semiconductor layer 24. In all the embodiments, the first semiconductor layer 22 is p-type and defines an anode. The second and third semiconductor layers 24, 26 are n-type and define a cathode. The first and second semiconductor layers 22, 24 thus form a p-n junction, wherein a depletion zone 18 is formed. The second semiconductor layer 22 has a low doping level, while the third semiconductor layer 26 has a high doping level and defines a back surface field. The association of the conductivity type with the semiconductor layers 22-26 is exemplary and can also take place in a complementary manner.

Figure 2A:
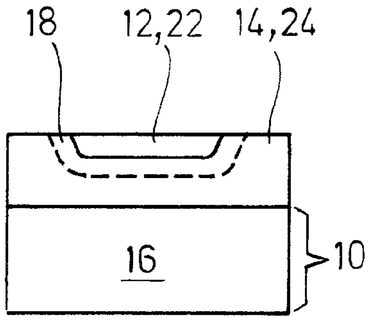
FIGS. 2A and 2B are schematic sectional views of a photodiode layer sequence produced in accordance with the method of FIG. 1 before and after the removal of the layer sequence.
Figure 2B:
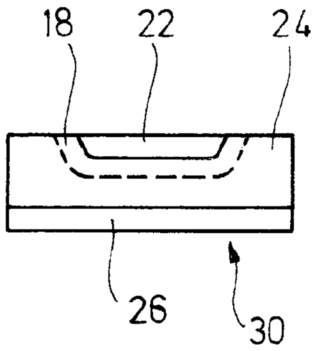

With reference to FIGS. 1, 2A and 2B, the first embodiment of the method in accordance with the invention will be explained in the following.

In step 101, a substrate wafer 10 composed of a semiconductor material, preferably a silicon single crystal, is provided. The substrate wafer 10 is highly n-doped and forms a third semiconductor region 16.

In step 102, a low doped, n-type layer is epitaxially grown on the substrate wafer 10 and forms the second semiconductor region 14.

In step 103, a p-type, tub-shaped first semiconductor region 12, which forms the anode of the photodiode 30, is provided by a front-side doping with a p-type material within the second semiconductor region 14. The boundary between the first and second semiconductor regions 12, 14 represents a p-n junction around which a depletion zone 18 is formed.

In step 104, a removal of the substrate wafer 10 from the rear side finally takes place, wherein a part of the third semiconductor region 16 is also removed. The remaining residual region of the third semiconductor region 16 adjoining the second semiconductor region 14 only has a thickness of a few micrometers and defines a back surface field in the photodiode 30.

Figure 3:
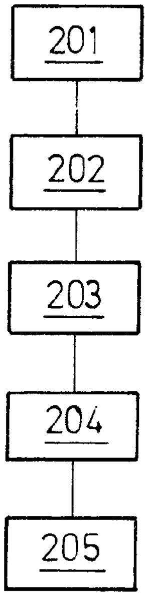
FIG. 3 is a flowchart of a method of producing a photodiode in accordance with a second embodiment.
Figure 4A:
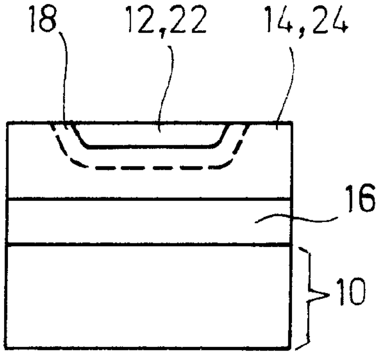
FIGS. 4A and 4B are schematic sectional views of a photodiode layer sequence produced in accordance with the method of FIG. 3 before and after the removal of the layer sequence.
Figure 4B:
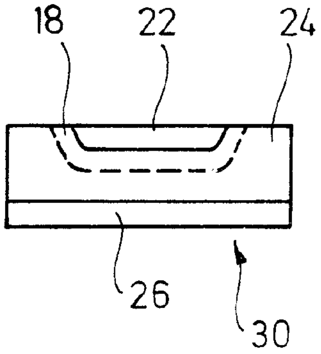

With reference to FIGS. 3, 4A, and 4B, the second embodiment of the method will be described in the following.

In step 201, an n-type substrate wafer 10, which has a low doping level, is provided.

In step 202, an n-type semiconductor layer, which has a high doping level and which forms a third semiconductor region 16, is epitaxially grown at the front side on the substrate wafer 10.

In step 203, a further n-type semiconductor layer is epitaxially grown that has only a low doping level in contrast to the third semiconductor region 16. This weakly doped n-type semiconductor layer forms a second semiconductor region 14.

In step 204, in the same manner as in step 104 of the first embodiment, a tub-like first semiconductor region 12, which forms the first semiconductor layer 22 or the anode of the photodiode 30, is finally formed by a front-side doping with a p-type material.

In step 205, the substrate wafer 10 is finally completely removed. To ensure that the third semiconductor layer 26 of the photodiode 30, which is formed by a part region of the third semiconductor region 16, has the desired thickness and in particular that no residues of the substrate wafer 10 are present there anymore, a rear-side part region of the third semiconductor region 16 is additionally also removed.

Alternatively to the epitaxial growth of the third semiconductor region 16, the third semiconductor region 16 can also be created by a front-side doping of the substrate wafer 10, in particular by means of diffusion or implantation, in accordance with step 202.

Figure 5:
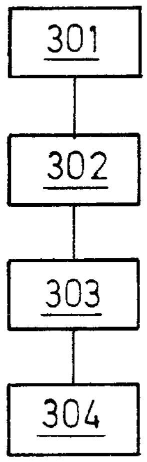
FIG. 5 is a flowchart of a method of producing a photodiode in accordance with a third embodiment.
Figure 6A:
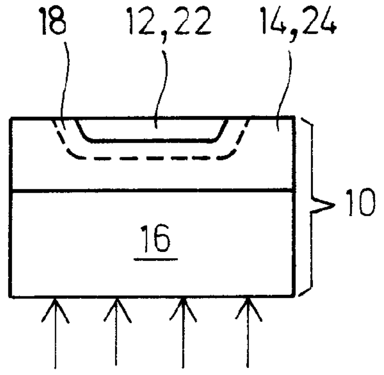
FIGS. 6A and 6B are schematic sectional views of a photodiode layer sequence produced in accordance with the method of FIG. 5 before and after the removal of the layer sequence.
Figure 6B:
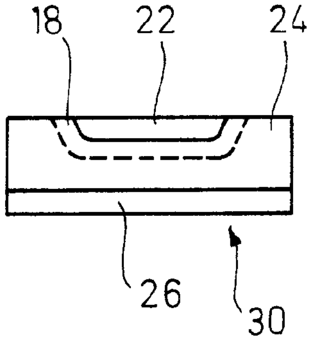
Figure 7:
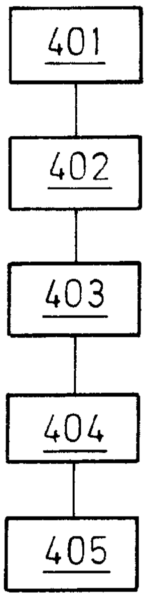
FIG. 7 is a flowchart of a method of producing a photodiode in accordance with a fourth embodiment.

With reference to FIGS. 5, 6A, and 6B, the third embodiment of the method will be described in the following.

In step 301, an n-type substrate wafer 10 having a low doping level is provided.

In step 302, the substrate wafer 10 is doped, preferably by means of diffusion, with n-type material from the rear side. The doping direction is indicated by arrows in FIG. 6A. The doping takes place with a large penetration depth, wherein a rear-side diffused or doped part region of the substrate wafer 10 forms a third semiconductor region 16 and a front-side non-diffused or non-doped part region of the substrate wafer 10 form a second semiconductor region 14. Thus, a boundary layer is formed within the substrate wafer 10 between the n-type, low-doped second semiconductor region 14 and the n-type, heavily doped third semiconductor region 16.

With such a deep doping of the substrate wafer 10 from the rear side, a doping gradient with the doping level decreasing inwardly can form within the substrate wafer 10. Therefore, the doping step 302 has to be designed such that a part region of the third semiconductor region 16 not removed during a subsequent removal still has the required doping concentration corresponding to the doping concentration of the third semiconductor layer 26. In this respect, higher doping concentrations than that which corresponds to the doping concentration of the third semiconductor layer 26 can definitely be present at the rear side of the substrate wafer 10.

In step 303, the production of a first semiconductor region 12, which forms the first semiconductor layer 22 or an anode of the photodiode 30, is again formed in the manner described above by a front-side doping.

In step 304, a rear-side part region of the third semiconductor region 16 is finally removed such that the remaining part region of the third semiconductor region 16 forms the third semiconductor layer 26 of the photodiode 30.

With reference to FIGS. 7 and 8A to 8C, the fourth embodiment of the method is now described.

In step 401, a substrate wafer 10 composed of a weakly doped, n-type semiconductor material is provided. The substrate wafer 10 first defines the second semiconductor region 14.

Figure 8A:
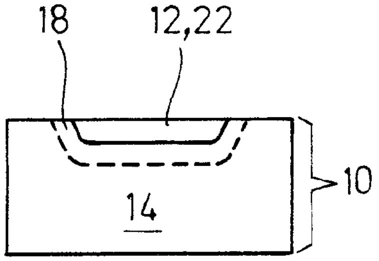
FIGS. 8A to 8C are schematic sectional views of a photodiode layer sequence produced in accordance with the method of FIG. 7 before and after the removal of the layer sequence.

In step 402, a p-type first semiconductor region 12, which forms the first semiconductor layer 22 or anode of the completed photodiode 30, is formed in the second semiconductor region 14 by a front-side doping in the manner already described. FIG. 8A shows the layer structure after step 402 has been performed.

In step 403, the substrate wafer 10 is now removed from the rear side, wherein a part of the second semiconductor region 24 is removed such that the thickness of the remaining part of the substrate wafer 10 corresponds to the thickness of the photodiode 30.

Figure 8B:
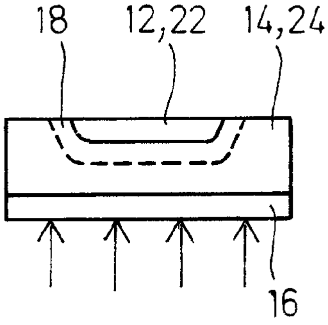
Figure 8C:
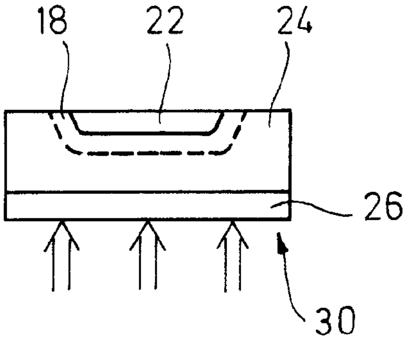

In step 404, a further n-type doping material (donors) is introduced into the substrate wafer 10 or into the second semiconductor region 14 from the rear side such that an n-type third semiconductor region 16 is formed in a part region of the second semiconductor region 14, wherein the doping level of the third semiconductor region 16 is higher than the doping level of the second semiconductor region 14. In FIG. 8B, the introduction of the doping material is shown by arrows. The doping preferably takes place by diffusion or also by ion implantation.

In step 405, a local heat treatment of the third semiconductor region 16 finally takes place from the rear side, wherein a process designated as laser annealing is preferably used. In this respect, the layer structure is irradiated with a high-energy laser beam such that, within a short time, temperatures are generated at the surface that are sufficient to cure lattice defects generated by the previous removal of substrate material and the subsequent doping. Due to the high, but time-limited energy supply, the heating of the layer structure is substantially limited to the third semiconductor region 16. The cured third semiconductor region 16 thus forms the highly doped third semiconductor layer 26 that defines a back surface field in the photodiode 30. Due to the curing of the third semiconductor region 16 by a local heat treatment, in particular by laser annealing, it is prevented that higher-lying structures of the photodiode 30 are damaged, in particular the p-n junction formed between the first and second semiconductor regions 12, 14. The local heat treatment is indicated by double arrows in FIG. 8C.

It has been shown that photodiodes 30 having a semiconductor thickness between 150 μm and 185 μm, and possibly even less, can be produced with all the embodiments of the method.

The growth or generation of the epitaxial layers takes place in a generally known manner, preferably by means of chemical vapor deposition (CVD). All other suitable epitaxy processes can, however, generally also be used. By adding corresponding doping materials on the deposition of the layers, the epitaxial layers can already be produced with the desired doping concentration.

REFERENCE NUMERAL LIST

10 wafer
12 first semiconductor region
14 second semiconductor region
16 third semiconductor region
18 depletion zone
22 first semiconductor layer
24 second semiconductor layer
26 third semiconductor layer
30 photodiode
101-104 method step
201-205 method step
301-304 method step
401-405 method step

The invention claimed is:

1. A method of producing a photodiode, the method comprising:

providing a substrate wafer composed of a semiconductor material;

producing a layer sequence having a first semiconductor region, a second semiconductor region, and a third semiconductor region on and/or in the substrate wafer, wherein the first and second semiconductor regions form first and second semiconductor layers, respectively, and wherein the first semiconductor layer is a front-side layer of a first conductivity type, and the second semiconductor layer is of a second conductivity type into which the first semiconductor layer is embedded, wherein producing the layer sequence comprises creating the second semiconductor region by epitaxial growth on the third semiconductor region; and partly removing the layer sequence from a rear side of the substrate wafer to form an adjoining rear-side third semiconductor layer of the second conductivity type having a higher doping concentration in comparison with the second semiconductor layer, such that the third semiconductor region is reduced to a thickness of the third semiconductor layer;

wherein the first and second semiconductor layers define a p-n-junction, and the third semiconductor layer defines a back surface field, and wherein a ratio of the thickness of the third semiconductor layer to a thickness of the layer sequence is not more than 0.25.

2. A method in accordance with claim 1, wherein the third semiconductor region is formed by the substrate wafer.

3. A method in accordance with claim 1, wherein producing the layer sequence comprises creating the third semiconductor region by a front-side introduction of a doping into the substrate wafer, by diffusion or ion implantation.

4. A method in accordance with claim 1, wherein producing the layer sequence comprises creating the third semiconductor region by epitaxial growth on the substrate wafer.

5. A method in accordance with claim 4, wherein partly removing the layer sequence comprises completely removing the substrate wafer.

6. A method in accordance with claim 1, wherein producing the layer sequence comprises creating the first semiconductor region after the second semiconductor region and/or creating the second semiconductor region after the third semiconductor region.

7. A method in accordance with claim 1, wherein producing the layer sequence comprises creating the first semiconductor region by a front-side doping into the second semiconductor region by ion implantation.

8. A method in accordance with claim 1, wherein the first conductivity type is p-type and the second conductivity type is n-type, and/or the substrate wafer is formed from silicon.

9. A method in accordance with claim 1, wherein:

a thickness of the photodiode does not exceed 200 μm, and/or a thickness of the substrate wafer ranges between 300 μm and 220 μm, and/or the thickness of the third semiconductor layer does not exceed 20 μm.

10. A method in accordance with claim 1, wherein the ratio of the thickness of the third semiconductor layer to the thickness of the layer sequence does not exceed 0.10.

11. A method in accordance with claim 1, wherein the substrate wafer comprises a substrate wafer of the second conductivity type having the higher doping concentration, or the substrate wafer comprises a substrate wafer of the second conductivity type having a lower doping concentration.

12. A method in accordance with claim 1, wherein partly removing the layer sequence from the rear side of the substrate wafer comprises backside grinding.

13. A method in accordance with claim 1, wherein, before removing the layer sequence from the rear side of the substrate wafer, the substrate wafer is present in a defined thickness between 300 μm and 220 μm.

14. A method of producing a photodiode, the method comprising:

providing a substrate wafer composed of a semiconductor material;

producing a layer sequence having a first semiconductor region and a second semiconductor region in the substrate wafer, wherein the first semiconductor region forms a first semiconductor layer and the second semiconductor region forms a second semiconductor layer, and wherein the first semiconductor layer is a front-side layer of a first conductivity type, and the second semiconductor layer is of a second conductivity type into which the first semiconductor layer is embedded;

removing the layer sequence from a rear side of the substrate wafer by backside grinding until the second semiconductor region is reduced in thickness;

producing, after the backside grinding, a third semiconductor region forming a third semiconductor layer by a rear-side introduction of a doping into the second semiconductor region, by diffusion or ion implantation, wherein the third semiconductor layer is an adjoining rear-side third semiconductor layer of the second conductivity type having a higher doping concentration in comparison with the second semiconductor layer; and locally heating the third semiconductor region;

wherein the first and second semiconductor layers define a p-n-junction, and the third semiconductor layer defines a back surface field, and wherein a ratio of a thickness of the third semiconductor layer to a thickness of the layer sequence is not more than 0.25.

15. A method in accordance with claim 14, wherein locally heating the third semiconductor region comprises laser annealing.

* * * * *